United States Patent
Den Boef et al.

(10) Patent No.: US 7,440,079 B2
(45) Date of Patent: Oct. 21, 2008

(54) LITHOGRAPHIC APPARATUS, ALIGNMENT SYSTEM, AND DEVICE MANUFACTURING METHOD

(75) Inventors: Arie Jeffrey Den Boef, Waalre (NL); Andre Bernardus Jeunink, Bergeyk (NL); Henricus Petrus Maria Pellemans, Veldhoven (NL); Irwan Dani Setija, Utrecht (NL); Cas Johannes Petrus Maria Van Nuenen, Eindhoven (NL); Stefan Carolus Jacobus Antonius Keij, Breda (NL)

(73) Assignee: ASML Netherlands B.V., Veldhoven (NL)

( * ) Notice: Subject to any disclaimer, the term of this patent is extended or adjusted under 35 U.S.C. 154(b) by 477 days.

(21) Appl. No.: 11/232,236

(22) Filed: Sep. 22, 2005

(65) Prior Publication Data

US 2006/0215161 A1    Sep. 28, 2006

Related U.S. Application Data

(63) Continuation-in-part of application No. 10/946,334, filed on Sep. 22, 2004, now abandoned.

(51) Int. Cl.
  *G03B 27/52* (2006.01)
  *G03B 27/68* (2006.01)
(52) U.S. Cl. .......................... 355/55; 355/52
(58) Field of Classification Search .............. 355/52, 355/53, 55, 67–71; 250/548; 356/399–401, 356/508–509
See application file for complete search history.

(56) References Cited

U.S. PATENT DOCUMENTS

| | | | | |
|---|---|---|---|---|
| 6,628,406 | B1* | 9/2003 | Kreuzer | 356/508 |
| 6,809,827 | B2* | 10/2004 | Kreuzer | 356/508 |
| 6,961,116 | B2* | 11/2005 | Den Boef et al. | 355/53 |

FOREIGN PATENT DOCUMENTS

| | | | |
|---|---|---|---|
| EP | 1 148 390 A2 | 10/2001 |
| EP | 0 906 590 B1 | 8/2003 |
| EP | 1 434 103 A2 | 6/2004 |

* cited by examiner

*Primary Examiner*—Hung Henry Nguyen
(74) *Attorney, Agent, or Firm*—Pillsbury Winthrop Shaw Pittman LLP

(57) ABSTRACT

A lithographic apparatus according to one embodiment includes an alignment system for aligning a substrate. The alignment system comprises an illuminator system configured to illuminate an alignment mark on the substrate with an illumination spot, the alignment mark comprising a plurality of lines and spaces. The system also includes a combiner system configured to transfer two images of the illuminated alignment mark without spatial filtering of the images, rotate the images 180° relatively to each other, and combine the two images; and a detection system configured to detect an alignment signal from the combined images and to determine a unique alignment position by selecting a specific one of extreme values in the detected alignment signal.

50 Claims, 12 Drawing Sheets

LITHOGRAPHIC APPARATUS, ALIGNMENT SYSTEM, AND DEVICE MANUFACTURING METHOD

This application is a continuation-in-part of U.S. patent application Ser. No. 10/946,334, filed Sep. 22, 2004 now abandoned, which document is hereby incorporated by reference.

FIELD OF THE INVENTION

The present invention relates to a lithographic apparatus, an alignment system, e.g. for use in a lithographic apparatus, and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

An important step in a typical lithographic process is aligning the substrate to the lithographic apparatus so that the image of the mask pattern is projected at the correct position on the substrate. Semiconductor, and other, devices manufactured by lithographic techniques may require multiple exposures to form multiple layers in the device, and it is may be essential that these layers line up correctly. As ever smaller features are imaged, overlay requirements, and hence the accuracy required of the alignment process, become stricter.

In one known alignment system, described in EP-A-0,906,590 which document is hereby incorporated by reference, marks on the substrate comprise two pairs of reference gratings, one X and one Y, with the two gratings of the pair having slightly different periods. The gratings are illuminated with spatially coherent light and the diffracted light is collected and imaged on a detector array, the different diffraction orders having been separated so that corresponding positive and negative orders interfere. Each detector in the array comprises a reference grating and a photo detector. As the substrate is scanned, the output of the detector varies sinusoidally. When the signals from both gratings of a pair peak simultaneously, the mark is aligned. This type of system provides a large dynamic range and by using high diffraction orders, is relatively insensitive to mark asymmetry. However, the need to provide two gratings with different periods increases the amount of space required for the alignment marks on the substrate. It is desirable to minimize the amount of such "silicon real estate" devoted to alignment marks and therefore not available for production of devices, or for other purposes.

Another known alignment system, described in EP-A-1,148,390 which document is hereby incorporated by reference, uses a compact self-referencing interferometer to generate two overlapping images rotated over +90° and −90° which are then made to interfere in a pupil plane. An optical system and (optional) spatial filter selects and separates the first order beams and re-images them on a detector. The system described in EP-A-1,148,390 utilizes a special technique, also described as self-referencing on center of symmetry of an alignment mark. Also, this alignment system uses the envelope of the detected signal to determine the correct alignment position.

SUMMARY

A lithographic apparatus according to one embodiment comprises an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and an alignment system configured to illuminate an alignment mark on the substrate with an illumination spot, the alignment mark comprising a plurality of lines and spaces. The alignment system comprises a combiner system configured to transfer two images of the illuminated alignment mark without spatial filtering of the images, rotate the images 180° relatively to each other, and combine the two images, and a detection system configured to detect an alignment signal from the combined images and to determine a unique alignment position by selecting one of a plurality of extreme values in the detected alignment signal.

According to another embodiment, an alignment system for aligning a substrate comprises a spot source configured to illuminate an alignment mark on the substrate with an illumination spot; a combiner system configured to transfer two images of the illuminated alignment mark without spatial filtering of the images, rotate the images 180° relatively to each other, and combine the two images; and a detection system configured to detect an alignment signal from the combined images and to determine a unique alignment position by selecting one of a plurality of extreme values in the detected alignment signal.

A device manufacturing method according to a further embodiment comprises projecting a patterned beam of radiation onto a substrate; illuminating an alignment mark in a scribe lane on the substrate with an illumination spot, the alignment mark comprising a plurality of lines and spaces; transferring the images of the illuminated alignment mark without spatial filtering of the images; combining two images of the alignment mark that are rotated by 180° relative to each other; detecting an alignment signal from the combined images; and determining a unique alignment position by selecting an extreme value in the detected alignment signal.

A method of aligning a substrate according to a further embodiment comprises illuminating an alignment mark on the substrate with a spot, said alignment mark including an alternating plurality of lines and spaces; rotating at least one of two images of the illuminated mark with respect to the other such that a rotation of one of the images with respect to the other is substantially equal to one-hundred-eighty degrees to produce a combined image, said combined image being based on said two images subsequent to said rotating; detecting an alignment signal based on the combined image, said alignment signal including a plurality of locally extreme values having substantially equal amplitudes; and selecting one of a plurality of locally extreme values in the detected alignment signal.

An alignment system according to a further embodiment comprises a spot source configured to illuminate an alignment mark on a substrate with an illumination spot; a plurality of optical elements configured to rotate at least one of two images of the illuminated mark with respect to the other such that a rotation of one of the images with respect to the other is substantially equal to one-hundred-eighty degrees to produce a combined image, said combined-image being based on said two images subsequent to said rotating; a detector configured to detect an alignment signal from the combined image, said detected alignment signal including a plurality of locally extreme values having substantially equal amplitudes; and a signal analyzer configured to determine a unique alignment position by selecting one of a plurality of locally extreme values in the detected alignment signal.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

At least some embodiments of the invention may be applied to provide a lithographic apparatus which comprises an alignment system that delivers an accurate and unambiguous alignment position.

In at least one application of a lithographic apparatus and alignment system according to an embodiment of the invention, no separate sensor nor marks are needed solely for capturing.

Figure 1:
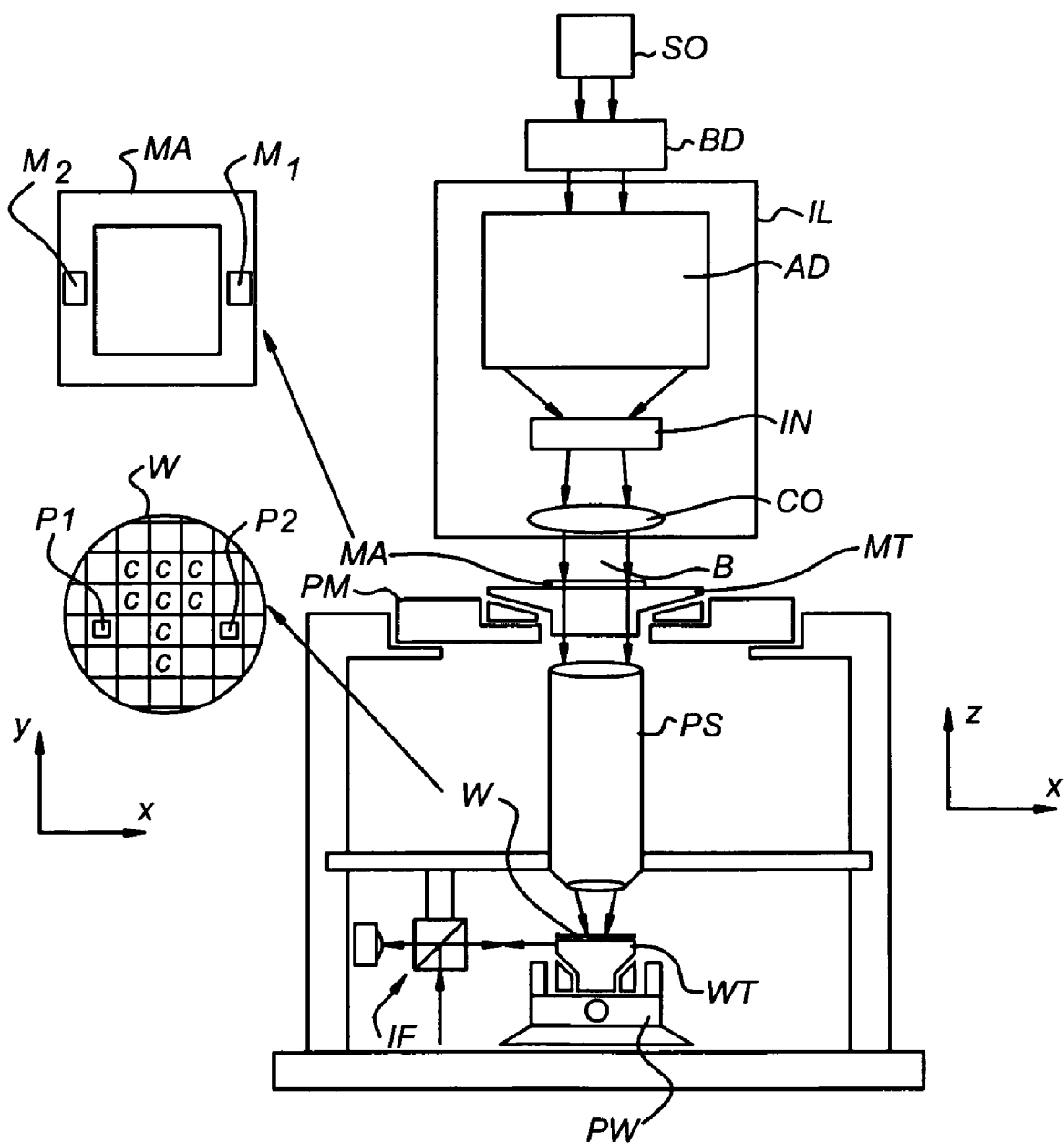
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an exciter laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometer device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In applications including alignment of a wafer in a lithographic apparatus, an alignment mark according to an embodiment of the present invention can be used for both coarse and fine wafer alignment. Such a use may result in less space on the wafer (real estate) being required for alignment purposes because one doesn't need separate marks for both phases. The fine wafer alignment will lead to a correct determination of alignment position without any ambiguity which is present in certain state of the art alignment systems. No additional gratings with a different periodicity, used especially for capturing, may be needed, resulting in less required real estate. Throughput costs of operational use (i.e. time spent for alignment of wafers) are not negatively influenced, as no additional capture gratings or marks have to be scanned. Also, the need for a separate capture sensor in a lithographic apparatus is eliminated.

The present apparatus and method can be advantageously applied when the alignment system is an alignment system not using spatial filtering. As a result of not using spatial filtering techniques in the alignment, sharp images are possible from the alignment mark for further processing. An example of such an alignment system not using spatial filtering is described in patent application EP-A-1,148,390, which description is incorporated herein by reference. The alignment system comprises an alignment sensor that is self referencing to the center of symmetry of any mark having 180° of symmetry. The image of the alignment mark is divided into two images, which are then rotated 180° with respect to each other, and are then coherently recombined with an interferometer. With proper phasing of the interferometer paths, the recombined image will interfere constructively or destructively in amplitude. A prism may be used to form the two images, rotate the two images with respect to each other, and interferometrically recombine the two images.

Figure 2:
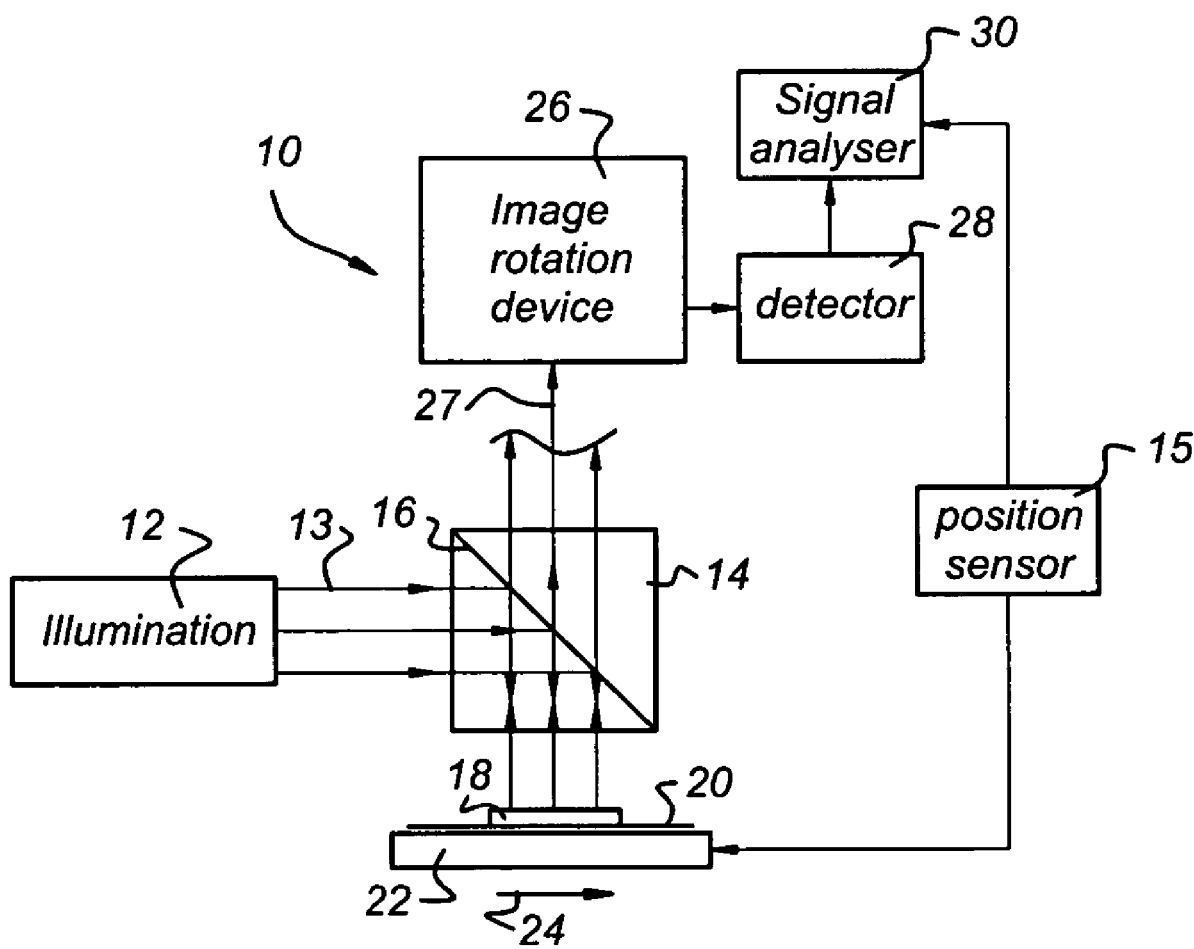
FIG. 2 shows a schematic view of an alignment system of the lithographic apparatus of FIG. 1.

In FIG. 2, a simplified schematic diagram is shown of an alignment system 10 as used in the lithographic apparatus according to one embodiment of the present invention. Alignment system 10 comprises an illumination source 12, such as a laser, providing electromagnetic radiation 13, to a beam splitter 14. A portion of the electromagnetic radiation is reflected off coating 16 to illuminate an alignment mark or target 18. The alignment mark 18 is placed on or within a photosensitive substrate or wafer 20. The photosensitive substrate 20 is placed on a stage 22. The stage 22 may be scanned in the direction indicated by arrow 24. Electromagnetic radiation diffracted from the alignment mark 18 passes through the beam splitter 14 and is collected by the image rotation device 26. It should be appreciated that a good quality image need not be formed, but that the features of the alignment mark 18 should be resolved. The image rotation device 26 may be any appropriate set of optical elements, and is preferably a combination of prisms, that forms two images of the alignment mark 18, rotates one of the images with respect to the other one hundred and eighty degrees, and then recombines the two images. The optical ray passing through the center of rotation established by the image rotation device 26, defines the sensor alignment axis 27. Detector 28 receives the electromagnetic radiation from the image rotation device 26. The detector 28 then provides signals to the signal analyzer 30. The signal analyzer 30 is coupled to the stage 22 such that the position of the stage is known (e.g. using a position sensor 15) when the center of alignment mark 18 is determined. Therefore, the position of the alignment mark 18 is very accurately known with reference to the stage 22. Accordingly, the location of the center of the alignment target 18 is known substantially exactly relative to a reference position. Additionally, the center of the mark may be very accurately determined even with a relatively poor image.

It is noted that the embodiment depicted uses a beam splitter 14 to direct the illuminating beam towards the alignment mark 18, and to direct the image from the mark 18 towards the image rotation device 26. It will be apparent to the skilled person, that other (optical) arrangements may be used to obtain the same result of illuminating the alignment mark 18 on the wafer 20 and detecting an image of the alignment mark 18.

An optical arrangement as shown in FIG. 2 is described in more detail with reference to a number of embodiments in the European patent application EP-A-1,148,390, which description is incorporated herein by reference. This document describes embodiments of an alignment system with a coherent illumination source, interferometric combination of an image pair, and a detection system with detection based on interferometric properties.

The detection system or detector 28 may be based on intensity measurement of the combined image, e.g. a detector on which the combined image is projected. The combination of the rotated images can be regarded as a convolution measurement method, as the images of the illuminated alignment mark 18 are overlaid on each other when the alignment mark 18 moves with respect to the illumination spot 7 (see below). In conventional alignment systems, reference gratings are used on which a periodic alignment mark is imaged, after which only certain grating orders are used for detection. As no pupil filtering (or spatial filtering) is present in an alignment system 10 according to at least some embodiments of the present invention, all image information can be used. This has as a further advantage that a capturing method according to at least some embodiments of the present invention does not need any intermediate steps: both fine wafer alignment and coarse wafer alignment (when necessary) use the same kind of illumination and detection. No intermediate steps like order filtering when using gratings as alignment mark are necessary.

The dimension of the illumination spot 7 is smaller than the length of the alignment mark 18 in a scribe lane direction in an embodiment of the present invention. This will provide sufficient signal data characteristics for an accurate and unambiguous alignment. However, it is also possible that the illumination spot 7 is larger than the length of the alignment mark 18 in the scribe lane direction.

A number of different alignment mark types may be used with the present alignment system 10, and a number of different types are described below.

In a particular embodiment the alignment mark 18 comprises N pairs of lines and spaces with a predetermined periodicity p, the illuminating spot 7 having a dimension in the scribe lane direction equivalent to M pairs of lines and spaces, resulting in a detected signal having a predetermined number of global extremes (e.g. $(2N-1)-2(M-1)$) with substantially equal value, and the specific one of extreme values is one of the global extremes. This embodiment allows to use edge detection, but with a mesa type signal envelope. All of the alignment mark 18 is used for (fine) alignment. As an example, the middle global minimum can be selected.

In a further set of embodiments, the alignment mark 18 comprises a combination of a first set of $N_1$ pairs of lines and spaces with a predetermined periodicity, and a second set of $N_2$ pairs of lines and spaces with the predetermined periodicity, the first and second set being separated by a space having a predetermined distance. The space is e.g. equal to an integer multiple of the periodicity pitch. Such a space may be used to provide an additional feature in the alignment mark 18, resulting in a distinct characteristic in the detected alignment signal, which can further aid in determining an unambiguous alignment position.

E.g., in a specific embodiment wherein $N_2<N_1$, the illuminating spot 7 has a dimension in the scribe lane direction equivalent to M pairs of lines and spaces, resulting in a detected signal having a predetermined number of global extremes with substantially equal value, and the second set of $N_2$ pairs causes a specific additional signal segment, in which the alignment system is further arranged to first select the largest extreme value in the additional signal segment, and then select the specific one of extreme values using the first selected top as a reference. This additional segment is easy to detect from the associated additional characteristic in detected signal, thus providing a more robust alignment system.

In another embodiment wherein $N_2=N_1$, the illuminating spot 7 has a dimension in the scribe lane direction equivalent to M pairs of lines and spaces, M being smaller than $(N_1+N_2)$, resulting in a detected signal having two segments of global extremes and a local segment between the two segments, and the alignment system is further arranged to select a local extreme in the local segment as the specific one of extreme values.

In a further embodiment of the alignment mark 18, sub segmentation of a periodic grating is used, which may result in a very specific pattern in the detected signal. The alignment mark 18 comprises n groups of m pairs of lines and spaces with a predetermined periodicity, resulting in an alignment signal having 2n−1 characteristic signal segments, and the specific one of extreme values is one of the global extremes. The characteristic signal segments may e.g. comprise a diamond shape of falling minima followed by rising minima. The illumination spot 7 has a dimension in the scribe lane direction corresponding to k groups, k being an integer, resulting in a very predictable expected shape of the detected alignment signal.

In a further embodiment of the present invention the alignment mark 18 comprises a first alignment mark structure in a scribe lane direction, and a second alignment mark structure comprising a set of n groups of m pairs of lines and spaces with a predetermined periodicity in a direction at a angle between zero and ninety degrees to the scribe lane direction (e.g. perpendicular), and the alignment system is arranged to scan the alignment mark at the angle to the scribe lane direction and to determine the specific one of extreme values. This allows to capture on the cross segmentation, saving scribe lane space, as no separate marks are needed for X and Y direction alignment. Again, optionally the illumination spot has a dimension in the scribe lane direction corresponding to k groups.

In a further embodiment, the selecting of one of a plurality of extreme values in the detected alignment signal comprises: constructing a template function associated with the alignment marker having a predetermined template interval; for a range of alignment positions, fitting the detected alignment signal with the template function for obtaining a multiple correlation coefficient as a function of alignment position; determining from the multiple correlation coefficient as function of alignment position an extreme value associated with the alignment marker template and determining the unique alignment position from the extreme value. By using such a template fit embodiment, the capture can be extended to arbitrary and non-periodic structures. The capture robustness is enhanced, and this template fit embodiment may be used also for fine alignment, which provides additional flexibility with regard to the choice of alignment mark.

Depending on the type of alignment mark used, and of the surrounding area of the alignment mark, the decision algorithm may be used in on of two variants. In a first variant, in which the extreme value is determined by determining all extreme values over a threshold value and selecting the sharpest extreme value. In a second variant, one of the extreme values has a largest value, and this extreme value is selected.

Figure 3:
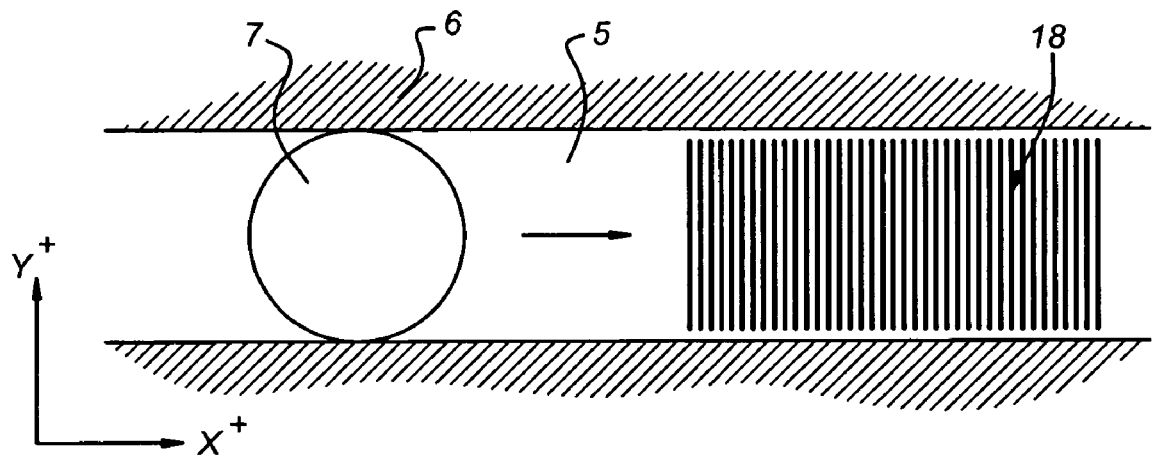
FIG. 3 shows a schematic view of an alignment mark according to an embodiment of the present invention.

In FIG. 3, a first embodiment of an alignment mark 18 is shown. The alignment mark 18 is positioned in a scribe lane 5 on a wafer 20 (of which die parts 6 are shown on both sides of the scribe lane 5). In the FIG. 3, also the scribe lane direction $X^+$, and the direction $Y^+$ perpendicular to the scribe lane direction are indicated.

In a typical exemplary embodiment, the width of the scribe lane 5 is about 40 μm. The length of the alignment mark 18 is about 80 μm, and comprises a large number of lines and spaces e.g. with a pitch of about 1 μm. In general, the alignment mark 18 has a length l and a plurality of N line/space pairs or mark elements with a pitch p. Thus, the number of line/space pairs N may also be determined by dividing the length l by the pitch p.

The alignment system 10 produces an illumination spot 7 on the wafer, and, due to the movement of the wafer stage 22, the alignment mark 18 will travel in the direction indicated by the arrow in FIG. 3 relative to the illumination spot 7. The illumination spot 7 has a dimension which generally corresponds to the scribe lane width, but is smaller than the length of the alignment mark 18. In other words, the alignment mark 18 is longer than the dimension of the illumination spot 7 in the scribe lane direction $X^+$.

Figure 4:
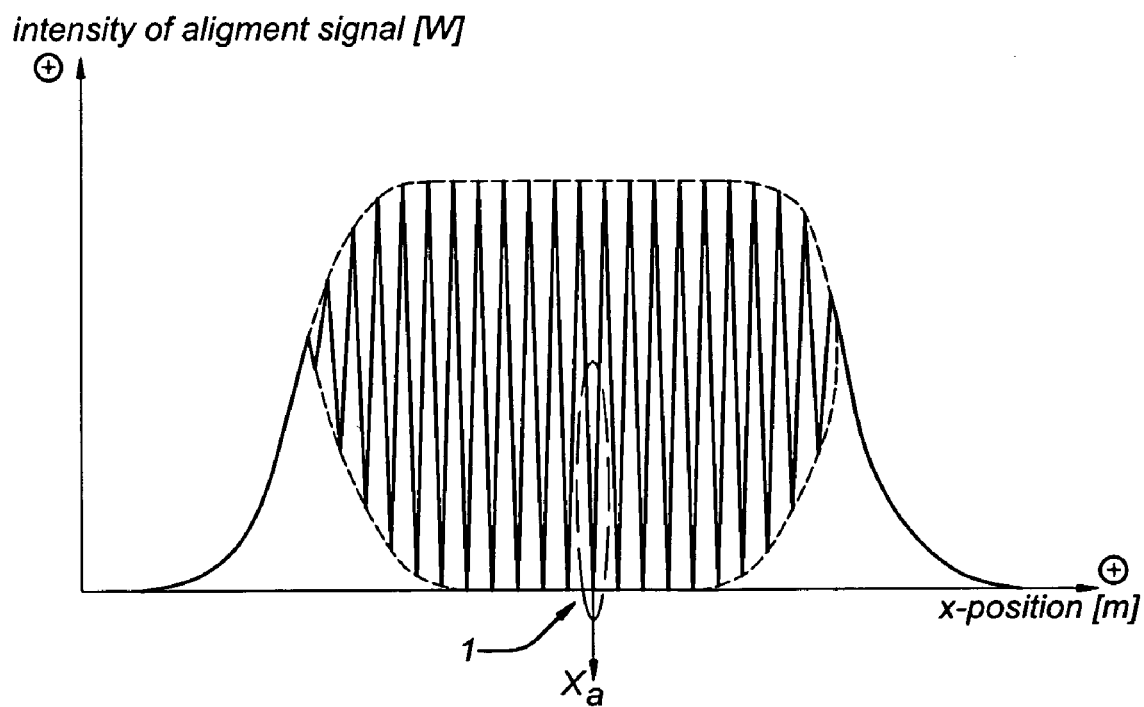
FIG. 4 shows a graph of a detected intensity signal versus position of the alignment system associated with the alignment mark shown in FIG. 3.

When the alignment mark 18 moves under the illumination spot 7 in the scribe lane 5, the detector 28 will provide an intensity signal as shown in FIG. 4. FIG. 4 shows an intensity signal value of the detector 28 versus the position of the wafer stage 22 in the X-direction. As the image rotation device 26 and detector 28 operate as a convolution detector, the signal will vary from substantially zero when the illumination spot 7 is not illuminating the alignment mark 18 to a maximum intensity value when the lines and spaces of the two images are not aligned (i.e. the line of one image overlaps a space of the other image). When a line of one image overlaps a line of the other image, destructive interference will cause a decrease of the detected intensity signal. Due to the convolution type of signal detection, an alignment mark 18 having N line/space pairs will result in an intensity signal having 2N−1 minimum values. Depending on how many line/space pairs of the two formed images overlap, the intensity of the signal will be higher. A global maximum value is obtained when the illumination spot 7 is entirely over the alignment mark 18 (illumination spot 7 illuminates a maximum number of lines).

In an ideal embodiment, the illumination spot 7 has straight leading and trailing edge in the scribe lane direction, which would result in illumination of an integer number of lines of the alignment mark 18. However, in more practical embodiments, the illumination spot 7 will be a rounded or even substantially round spot. When the alignment mark 18 is 'hit' by the illumination spot 7, this will result in the fact that initially, not the entire line(s) of the alignment mark 18 will be illuminated. However, this will only result in the amplitude of the detected signal being somewhat lower. The further description below is valid for both the ideal embodiments and the practical embodiments of the illumination spot 7.

When an alignment mark 18 as depicted in FIG. 3 is used, the resulting detected intensity signal will have characteristic as shown in FIG. 4: Of the total of 2N−1 extremes, a limited number of extremes will have the global minimum value, resulting in the mesa-type plot of FIG. 4. The slope of the envelope of the detected signal will depend on the sensitivity of the detector 28, and on the dimension of the illumination spot 7 (the more light hits the mark 18, the larger the output signal of the detector can be). Note that when the dimension of the illumination spot 7 in scribe lane direction is large enough to cover the entire alignment mark 18, the resulting detected signal will have a pyramid shaped envelope.

When the alignment mark 18 is a periodic mark having N pairs of lines and spaces (embodiment shown in FIG. 3), the middle position of the alignment mark 18 with respect to the reference of the alignment system (e.g. alignment axis 27 as shown in FIG. 2), can be determined by the position Xa of the middle global minimum in the intensity plot. When the illumination spot dimension in the scribe lane direction corresponds to the dimension of M line/space pairs (M<N), in general, there will be (2N−1)−2(M−1) global extreme values (peaks) in the intensity plot.

It would also be possible to take the (2N−1)/2the minimum value of all minimum values (peaks) present in the intensity plot. However, due to noise and other artifacts, one or more of the small value extremes at the start and end slope of the intensity plot may be missed, resulting in an incorrect alignment position Xa. By only looking at the global minimum values (i.e. the lows of the plot in the mesa-like part of the envelope of the plot of FIG. 4), it is possible to prevent this inaccuracy.

The number of extremes in the plot shown in FIG. 4 do not correspond to the exemplary dimensions shown in FIG. 3 or to the example dimensions described above for clarity reasons. When the pitch of the alignment mark 18 is e.g. 1 µm as described above, the distance between two global minimum values in the plot of FIG. 4 will be 0.5 µm.

Apart from picking the right top from the plot of FIG. 4, it is also possible to use other characteristic features of this plot, such as the slopes of the envelope of the plot of FIG. 4, or the initial part of the detected signal without extremes.

Figure 5:
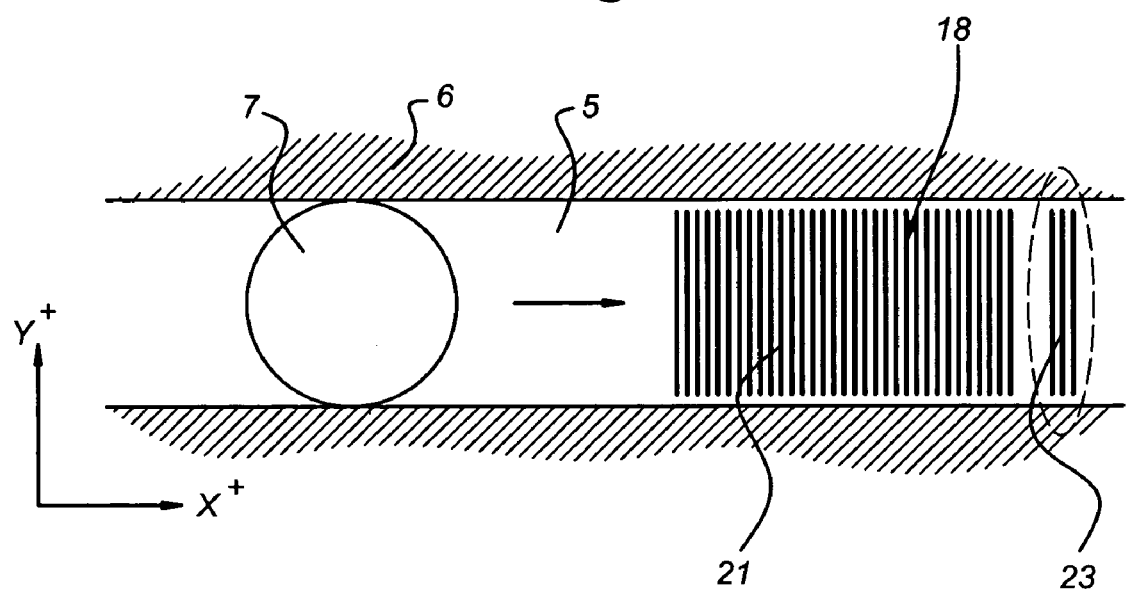
FIG. 5 shows a schematic view of an alignment mark according to a second embodiment of the present invention.

In FIG. 5, a further embodiment of the alignment mark 18 is shown, in which the alignment mark 18 comprises a first part 21, having $N_1$ pairs of lines and spaces, and a second part 23, which comprises a set of $N_2$ lines and spaces (e.g. $N_2$=3, second part 23 is a triplet), in which the first and second part are separated by a space of at least one line and space pair. The alignment mark 18 according to this embodiment can also be regarded as having a length l, and having a plurality of line/space pairs with a pitch p, in which a number of line/space pairs are left out. Still, the detected signal will have a total of 2N−1 minima, in which N=l/p, and $N_1+N_2$<N.

Figure 6:
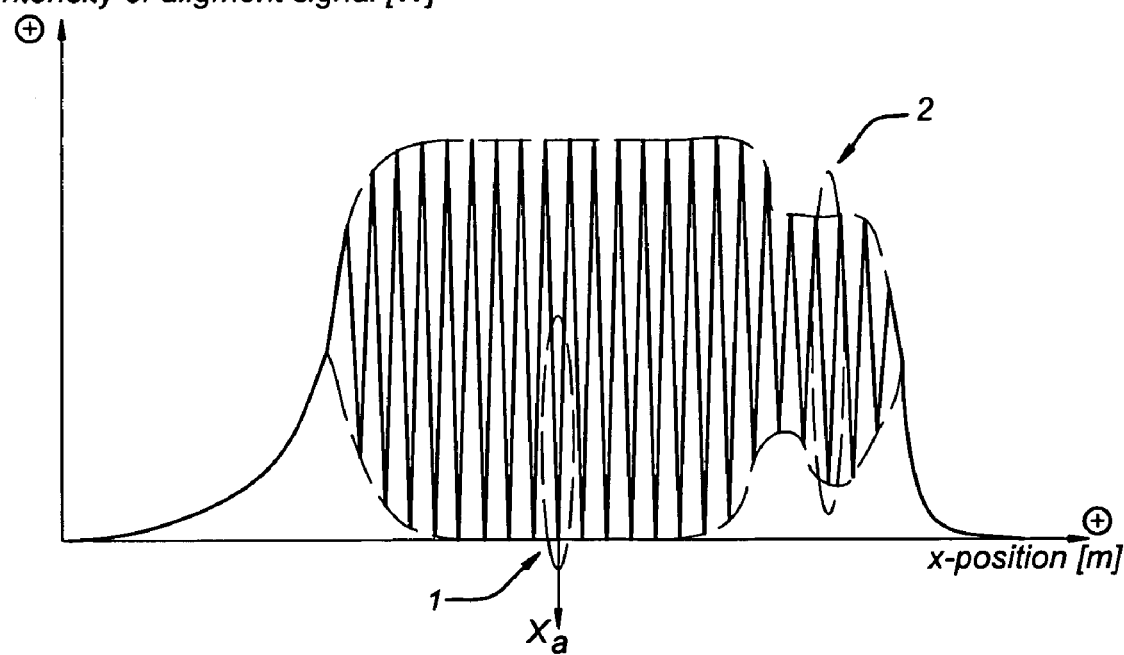
FIG. 6 shows a graph of a detected intensity signal versus position of the alignment system associated with the alignment mark shown in FIG. 5.

This alignment mark 18 will result in a detected signal which is shown in FIG. 6. In this plot, a characteristic feature caused by the triplet is visible: a diamond like envelope with decreasing and increasing slope of the various minima. It may be relatively easy to detect the deepest minimum of this diamond-like envelope, and from this, the position where the alignment axis 27 of the illumination spot 7 is exactly over the center of the triplet second part 23 is known. From this position, again, the correct top of the set of global minima can be selected, depending on the dimensions and properties of the alignment mark 18.

For the embodiments as described in this description, it is also possible to use correlation techniques to determine the right alignment position of the alignment mark 18 with respect to the lithographic apparatus. It may then be desirable to take the complete signal as obtained by the alignment system (i.e. the plots as exemplified in FIGS. 4, 6, 8, 10 and 13) and correlate or match this signal with a predetermined signal (pattern), and to detect the proper aligned position from this correlation. Further embodiments using this correlation technique alternative are discussed in further detail with reference to FIGS. 14-17 below.

When the total length of the alignment mark 18 in the embodiment shown in FIG. 5 is equal to the length of the alignment mark 18 in FIG. 3 (using the same pitch), the total number of global minimum values will be smaller, but still it is possible to provide an unambiguous alignment position.

Figure 7:
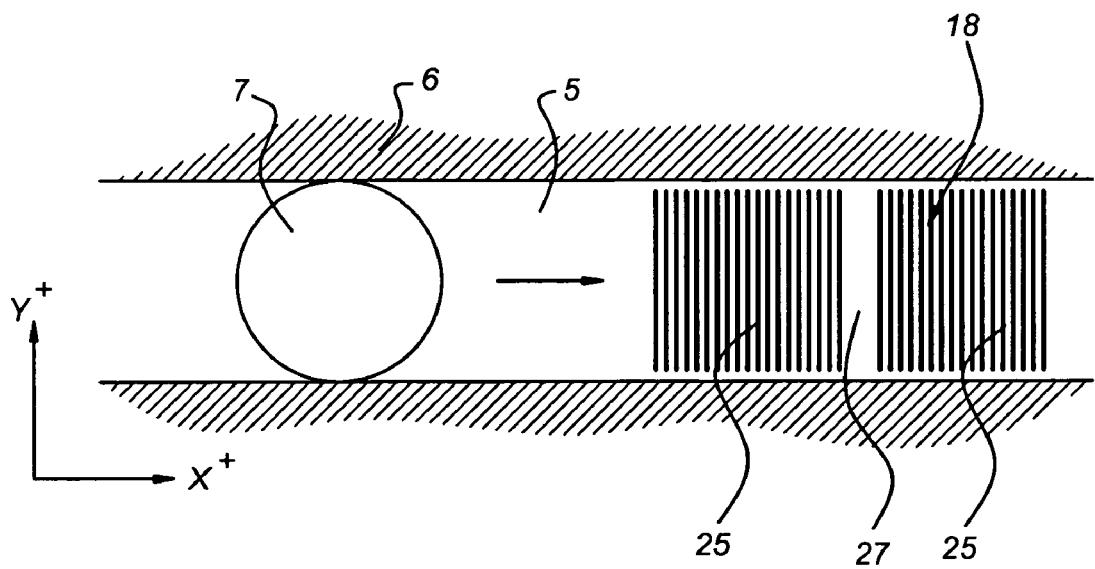
FIG. 7 shows a schematic view of an alignment mark according to a third embodiment of the present invention.

The embodiment shown in FIG. 5 may suffer from the fact that the characteristic signal envelope caused by the second part 23 has a relatively low amplitude, which may make proper capturing problematic. To solve this, the embodiment shown in FIG. 7 is proposed. Here, the alignment mark 18 comprises two identical parts 25, e.g. each having n pairs of lines and spaces with a predetermined pitch p (e.g. 1 µm), which are separated in the middle by a space region 27, having a dimension equal to a number of lines and spaces with the same predetermined pitch p. In other words, the alignment mark 18 may be regarded as a number of N line and space pairs (N>2n), wherein a number of line and space pairs are omitted in the middle. It is noted that in an alternative embodiment, a so called phase jump mark 18 may be used also, in which the two mark parts 25 have the same period, but a different phase. A phase jump mark 18 is discussed in European patent application EP-A-1,434,103, which is incorporated herein by reference.

Figure 8:
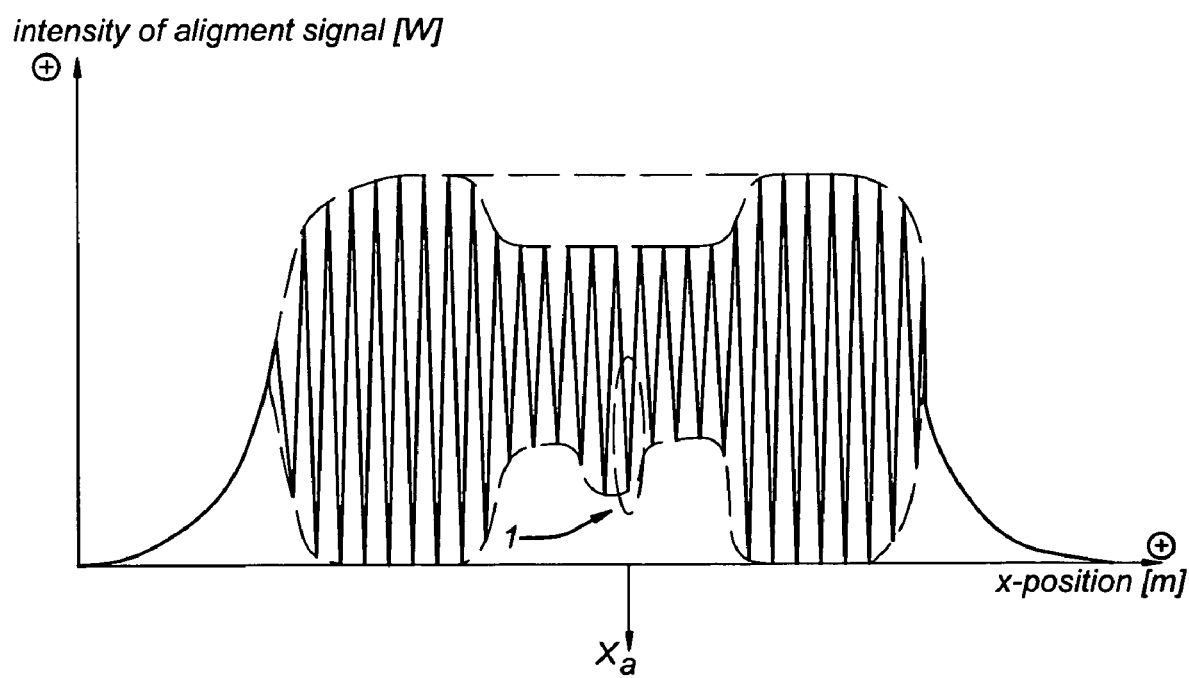
FIG. 8 shows a graph of a detected intensity signal versus position of the alignment system associated with the alignment mark shown in FIG. 7.

This type of mark 18 will result in a signal of the detector 28 as shown in FIG. 8. The missing lines in the middle of the alignment mark 18 will result in a drop in the size of the minima of the detected signal. When the number of pairs of lines and spaces left out is not too high (e.g. 3 or 4 pairs), the resulting plot will have distinct differences with the plot as shown in FIG. 4. The number of missing lines in relation to the dimension of the illumination spot 7 in the scanning direction $X^+$ will determine which effect will be visible. The alignment position Xa can then be determined by choosing the local extreme of the envelope in the affected area of the signal plot of FIG. 8.

By determining a local extreme, it is easier to determine the correct alignment position Xa when the detected signal comprises noise (e.g. by contamination of alignment mark 18, or non-zero scanning offset where the illumination spot 7 also illuminates structures on the die 6 next to the scribe lane 5).

Figure 9:
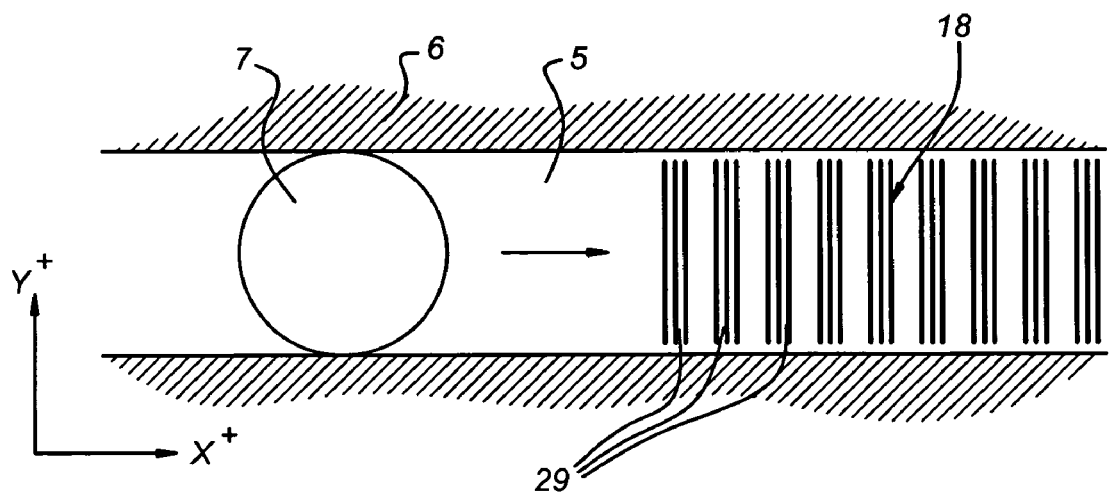
FIG. 9 shows a schematic view of an alignment mark according to a fourth embodiment of the present invention.
Figure 10:
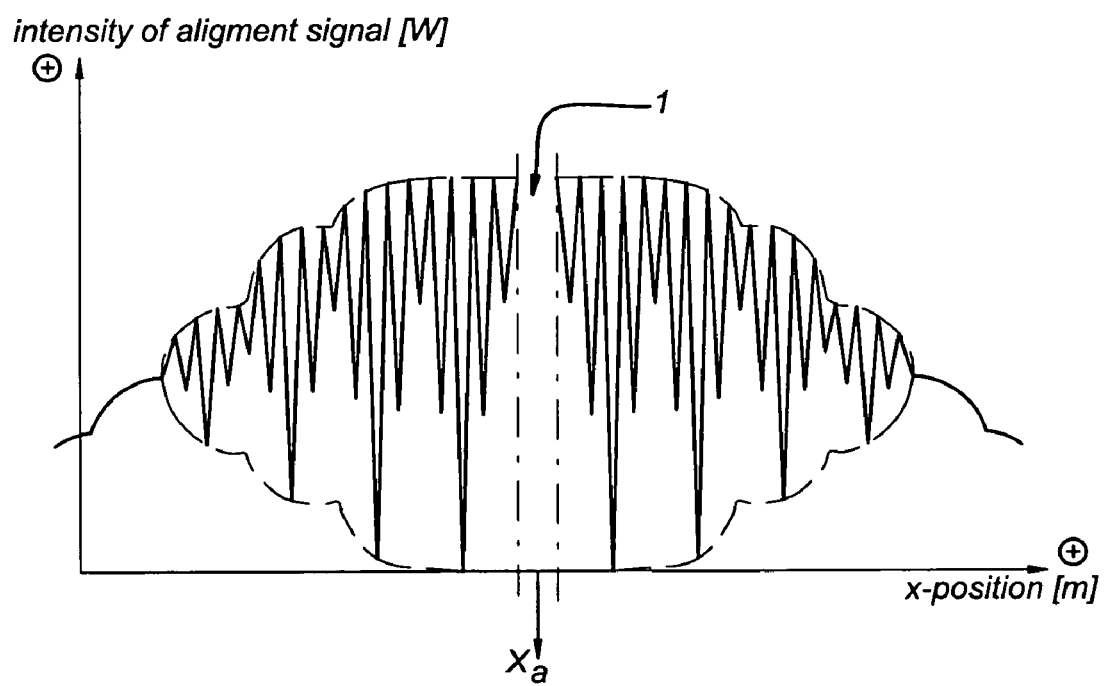
FIG. 10 shows a graph of a detected intensity signal versus position of the alignment system associated with the alignment mark shown in FIG. 9.

An even further embodiment of the present invention is shown in FIG. 9. This embodiment will probably make the capture mechanism even more robust. Here, the alignment mark 18 is a so called "periodic grating with sub segmentation", having a number of line/space groups 29 (nine groups being shown in the embodiment of FIG. 9), with a first pitch distance p, in which each line/space group 29 comprises a number (e.g. three as shown in FIG. 9: triplets) of line and space pairs with a second pitch distance p2. When the first pitch distance p is a multiple integer of the second pitch distance p2, the resulting intensity signal from the detector 28 will be as shown in FIG. 10. A number of diamond like envelopes will result, in which the number of minima depends on the number of line/space pairs in each line/space group, and the distance between each group. Again, when l is the length of the total alignment mark 18, the total number N of present or non present line/space pairs is equal to l/p, which will result in a total of 2N−1 minima (peaks) in the intensity signal. Also for the second periodicity structure, having a pitch of $p_2$, there will be $2(l/p_2)-1$ characteristic features in the intensity signal.

The embodiment shown in FIG. 9 has nine groups 29 of triplets, and the illumination spot 7 has a dimension in the $X^+$ direction covering four groups as a maximum. This will result in the intensity profile as shown in FIG. 10, having seventeen series of rising and falling maxima, each series having five minima, resulting in 85 peaks. The alignment mark of FIG. 9 comprises nine sub groups of each 3 line/space pairs, each sub group being spaced by a distance equal to two line/space pairs. Thus, in this case, N=l/p=8×5+3=43, and 2×43−1=85 peaks are present in the intensity signal, in 2×9−1=17 characteristic signal features.

Of the seventeen series, eleven series are showing a global minimum. In this case, the alignment position Xa can easily be determined by picking the middle minimum.

Figure 11:
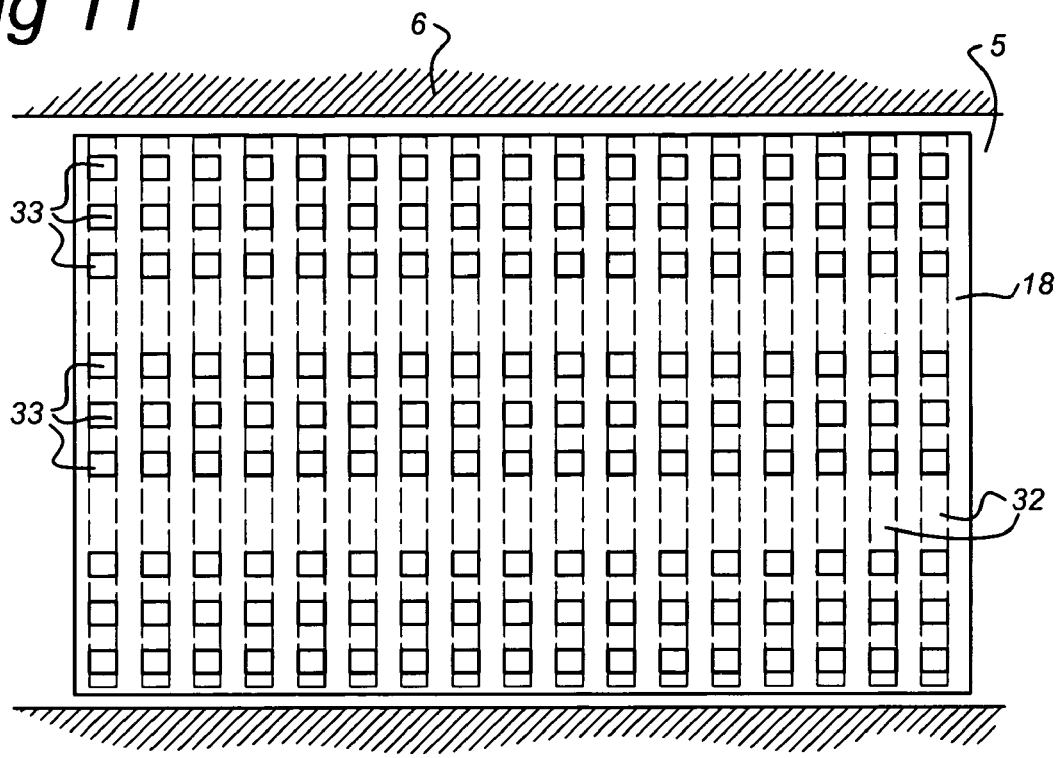
FIG. 11 shows a schematic view of an alignment mark according to a fifth embodiment of the present invention.

A further embodiment of the present invention uses a conventional alignment mark 18 augmented with a further alignment mark structure having a periodic structure with sub segmentation. An example of this embodiment is shown in FIG. 11, which shows the alignment mark 18 positioned in the scribe lane 5 of a wafer in between dies 6. In the X direction of the scribe lane 5, the alignment mark 18 comprises a plurality of lines and spaces 32 having a set periodicity (same pitch). In the direction perpendicular to that (Y direction), the alignment mark 18 comprises a cross-segmentation, which comprises a number of line/space groups 33. In this example, each group 33 comprises three lines with a predetermined pitch, and between each group 33 is a predetermined distance. The person skilled in the art will understand that more groups 33 may be provided, as well as a smaller or larger number of line/space pairs per group 33. Also, it will be apparent that the cross-segmentation may also be under a different angle than perpendicular. In general, the cross-segmentation may be under an angle between substantially zero and ninety degrees.

Figure 12:
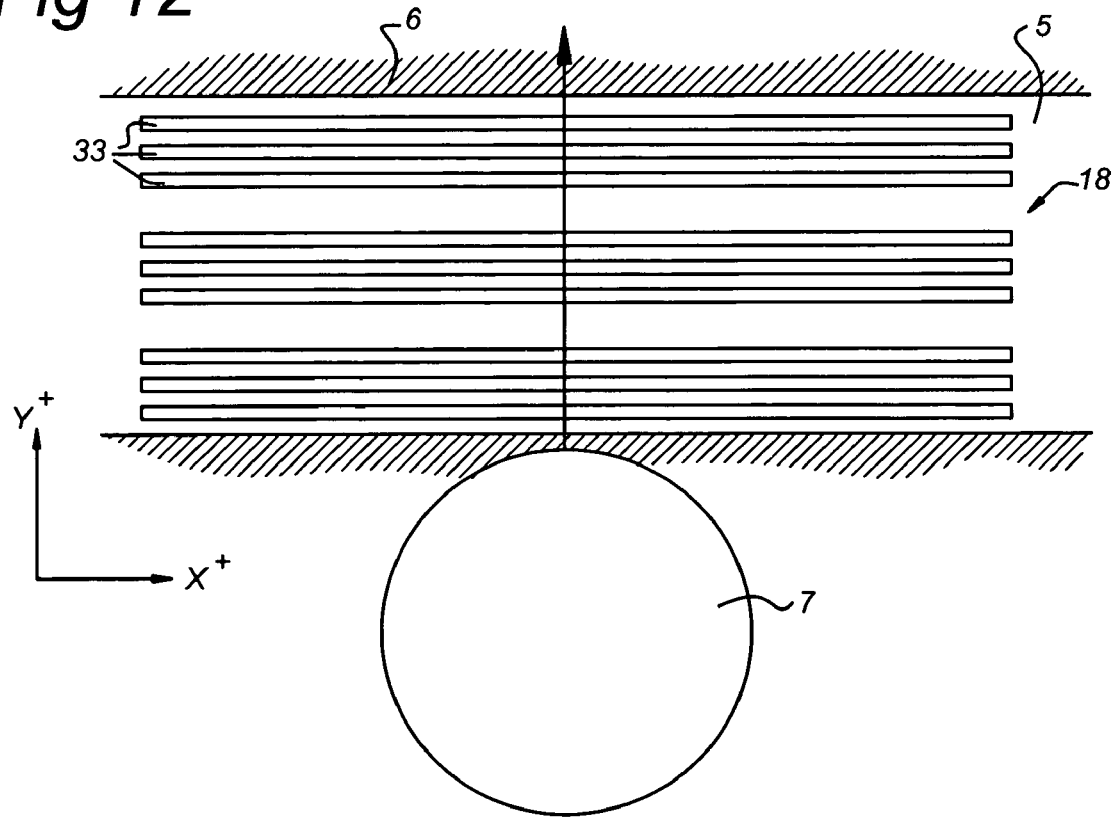
FIG. 12 shows a schematic view of the alignment mark of FIG. 11 as perceived by the alignment system.
Figure 13:
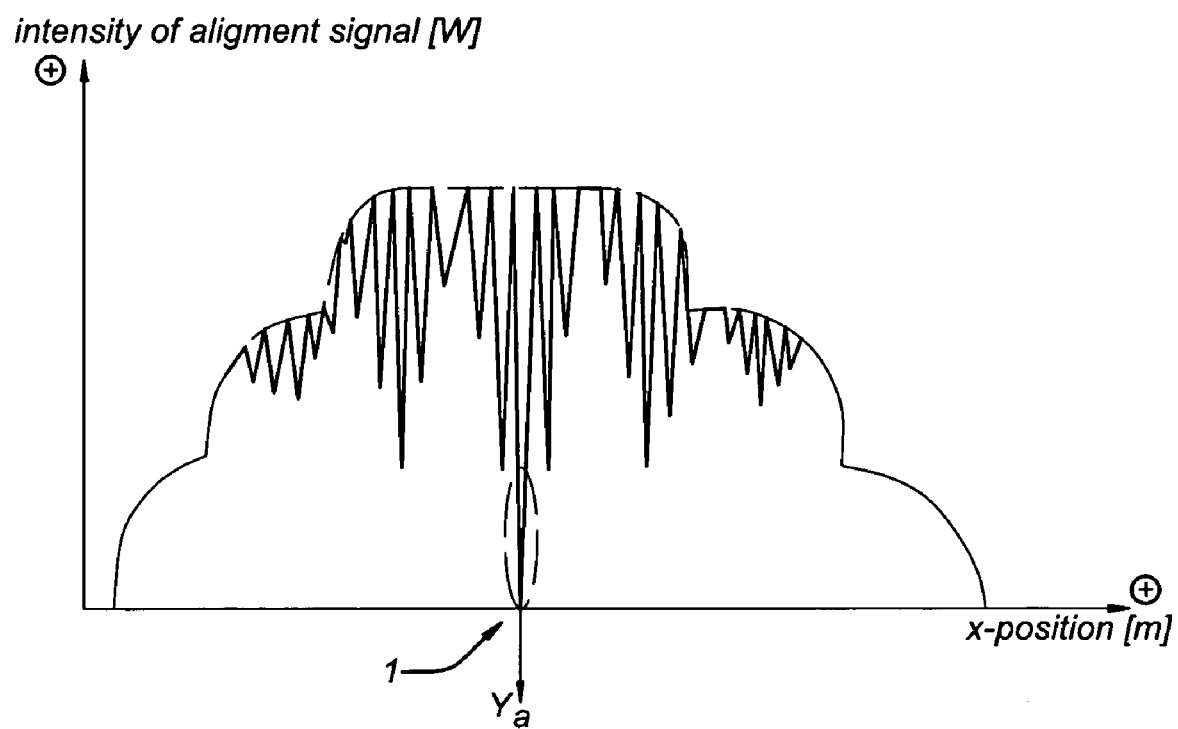
FIG. 13 shows a graph of a detected intensity signal versus position of the alignment system associated with the alignment mark shown in FIG. 11.

When the scribe lane is scanned by the illumination spot 7 in the $Y^+$-direction, the alignment system 10 will actually perceive an alignment mark 18 comparable to the alignment mark 18 as described with reference to FIG. 9 (see FIG. 12). The resulting intensity signal as detected by detector 28 against the wafer stage position is shown in FIG. 13. The signal shows a double period, where the finer period is given by the fine separation of the lines, while the coarser period is given by the separation of the groups. Again, a number of diamond-like envelopes (of a series of rising and falling minimum values) results, of which in this case the lowest peak in the middle diamond-like envelope is chosen to indicate the alignment position Ya in the $Y^+$ direction. It is however noted that a possibility exists that scan direction and trajectory of the alignment system are aligned such that the detected signal shows no features as discussed above.

This embodiment would e.g. allow to perform a coarse wafer alignment on a set of two alignment marks 18, each having a periodic structure (possibly with sub-segmentation) in both the X- and Y-direction. The two structures in X-direction will provide an initial alignment in Y-direction, and the two structures in Y-direction will provide an initial alignment in X-direction. These initial alignments provide a coarse wafer alignment grid, from which the initial position for fine wafer alignment may be determined using the same scan results.

To be able to use the alignment method as described with reference to the above exemplary embodiments of the alignment mark 18, it may be necessary to have a proper starting position of the illumination spot 7 with respect to the scribe lane 5. Therefore, the alignment system 10 may be further arranged to obtain an initial position of the alignment mark 18 for aligning the illumination spot 7 with the alignment mark 18. Initial positioning may already be obtained when the initial wafer load accuracy of the lithographic apparatus is sufficiently accurate. Alternatively, the initial positioning may be obtained using conventional coarse wafer alignment methods, e.g. diagonal scan techniques (see e.g. the description of such techniques in European patent application EP-A-1,434,103, which description is incorporated herein by reference).

The graphs of detected signals of FIGS. 4, 6, 8, 10 and 13 show the extremes of the detected signals as minimum values (peaks). Depending on the specific structure of the alignment sensor, the detected signal may be the result of destructive interference of the two mutually rotated images, thus resulting in minimum values as extremes. However, for the skilled person it will be clear that alternatives are possible (e.g. resulting in a constant value minus the signal as shown in the mentioned figures), and that in the above description the term minimum (or minimum value) may also be a maximum (or maximum value) according to the specific circumstances.

As mentioned above, further embodiments of the present invention may be envisaged which use signal matching techniques to determine the unambiguous alignment position. This group of embodiments can be used when the alignment mark 18 used is surrounded by other metrology targets, such as other alignment marks.

Figure 14:
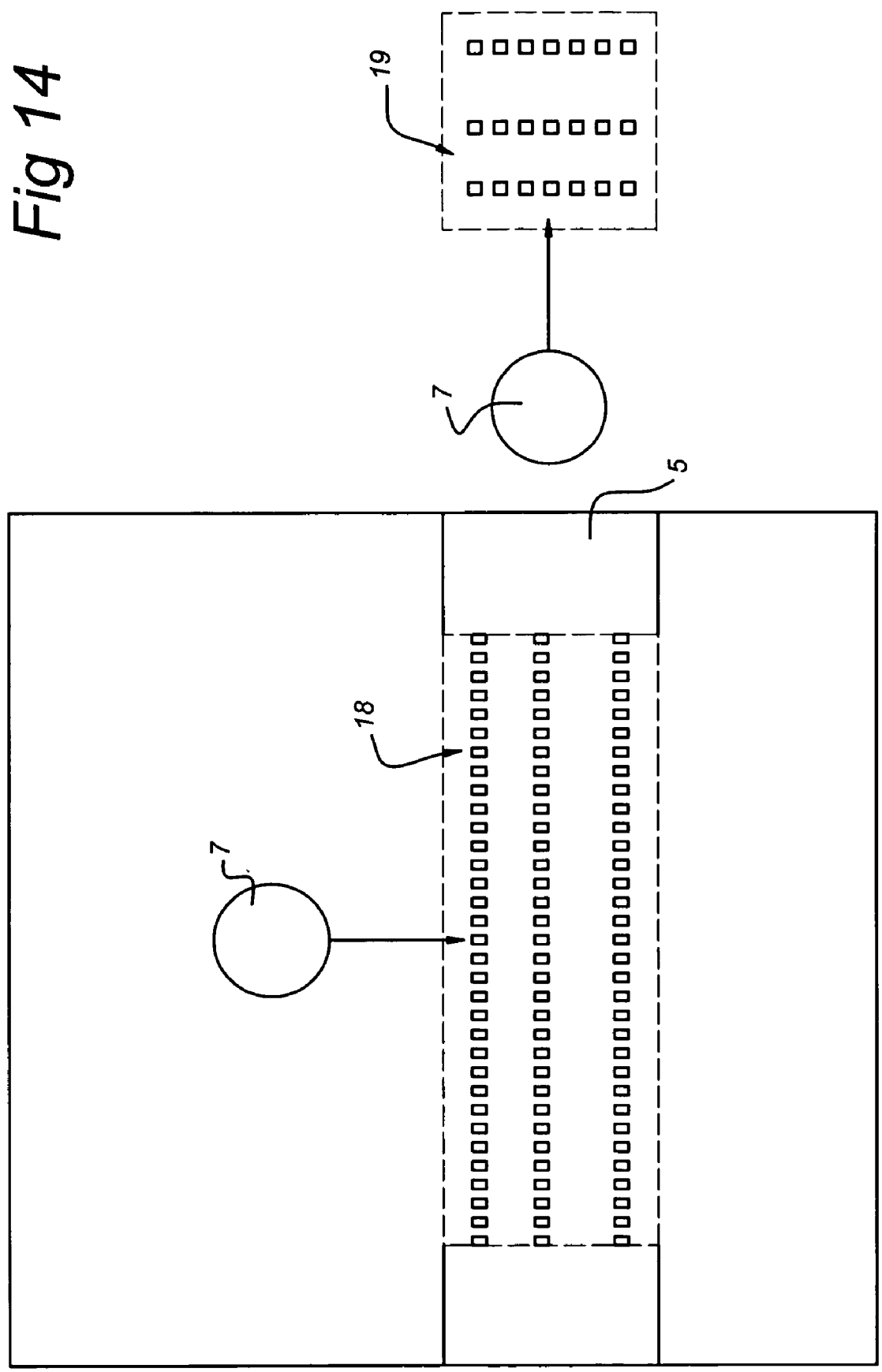
FIG. 14 shows a schematic view of an alignment mark according to a sixth embodiment of the present invention.

In FIG. 14, an example is shown of an alignment mark 18 in a scribe lane 5, which is used for alignment in a first direction, together with a further metrology mark 19, which may be used for alignment in a second direction (usually sequentially), using the same illumination spot 7.

The goal of signal processing for capture is to recognize the characteristics of the capture mark signal in a sea of unknown signal features. The most evident way to perform this task is to compare every interval of the total alignment signal, to the signal from an isolated capture mark or the alignment mark 18. This characteristic piece of signal is called a "template".

At every interval of the total alignment signal, the template is fitted to the data points and the residuals of the fit are evaluated. This gives the sum of squared residuals (or $\chi^2$) as a function of position. This is illustrated with the example of FIG. 14.

Figure 15:
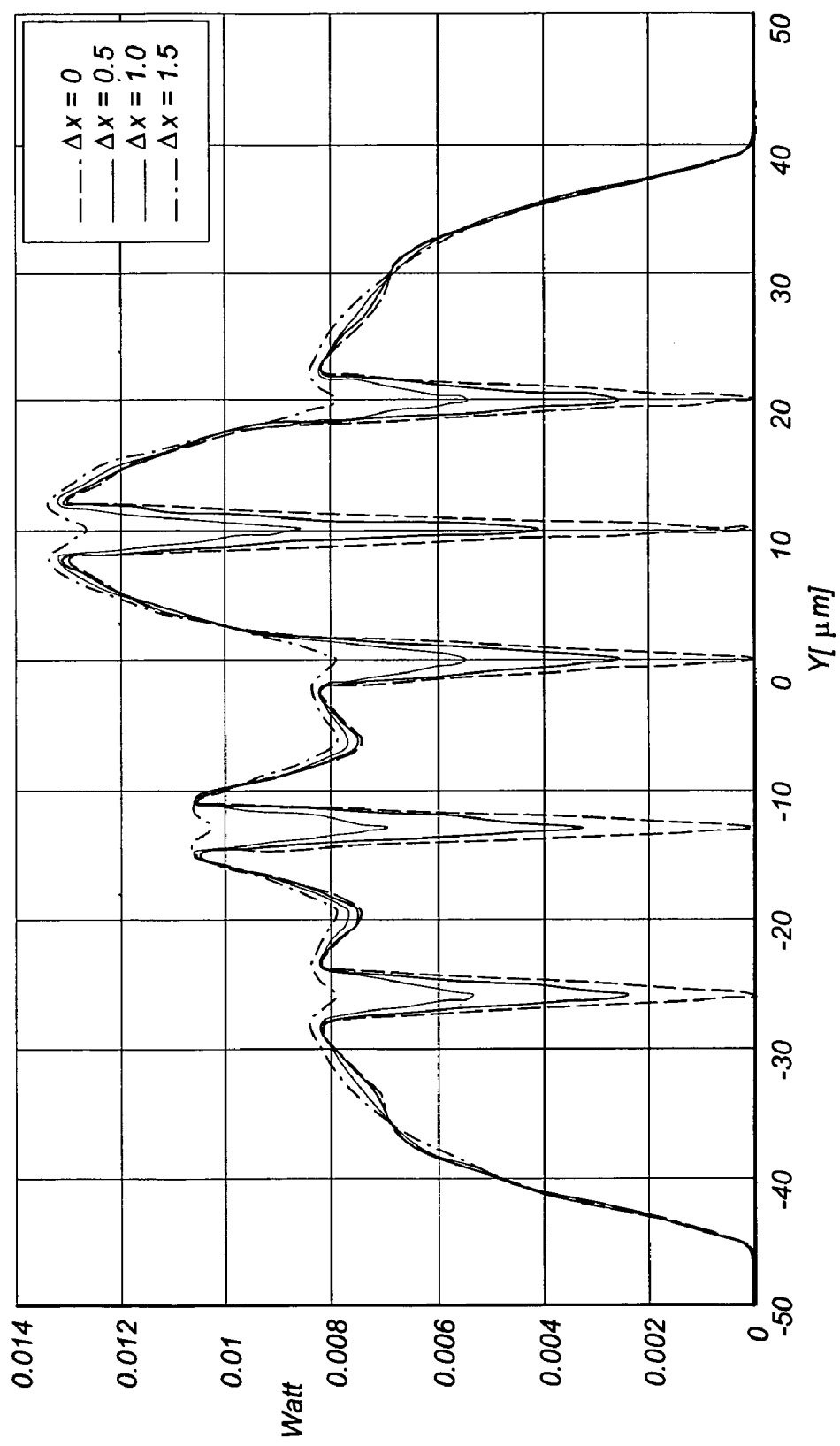
FIG. 15 shows a graph of a detected intensity signal versus position of the alignment system associated with the alignment mark shown in FIG. 14 for a number of offsets.

The signal from an isolated alignment mark 18 is plotted in FIG. 15, which shows the alignment signal for various offsets $\Delta x$ in a direction perpendicular to the alignment direction. As a template the inner three peaks of the signal are chosen since these are free from crosstalk.

Figure 16:
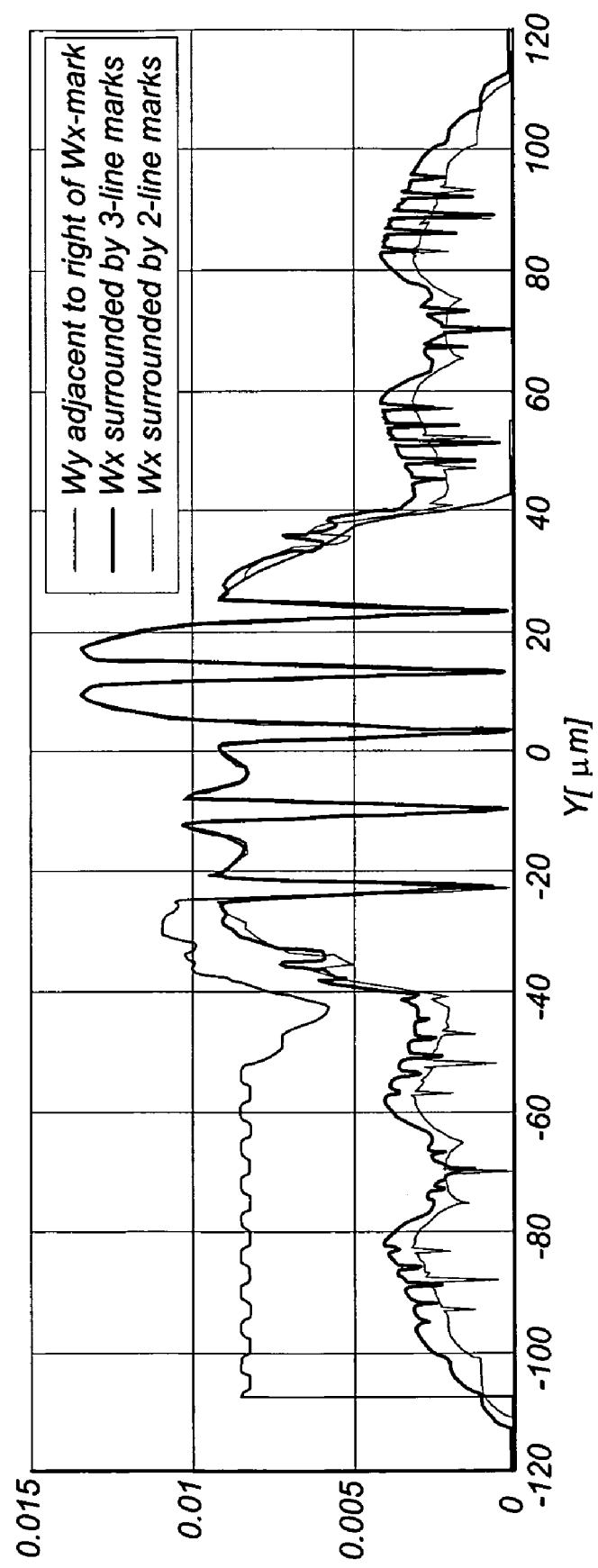
FIG. 16 shows a graph of a detected intensity signal versus position of the alignment system associated with the alignment mark shown in FIG. 14 with a further metrology mark in its vicinity.

During a capture scan, a long scan is made (or a series of long scans) over an area where alignment mark 18 is expected to be. FIG. 16 shows a calculated example of such a signal from the alignment mark 18 from FIG. 14 surrounded by other metrology targets. A first plot (medium line) gives the alignment signal for the alignment mark 18 of FIG. 14 with an additional (similar but perpendicular) alignment mark 19 to the right of the alignment mark 18 (as shown in FIG. 14). The (periodic) disturbance of the alignment signal, caused by the additional alignment mark 19, can be clearly seen at the negative values of Y. Also, other types of further metrology marks 19 may be present. In FIG. 16 further plots are shown for the alignment mark 18 surrounded by a 3-line mark (bold line), and surrounded by a 2-line mark (thin line). The signal at values of Y further away from the central position, show the different disturbances caused by these metrology marks 19.

Figure 17:
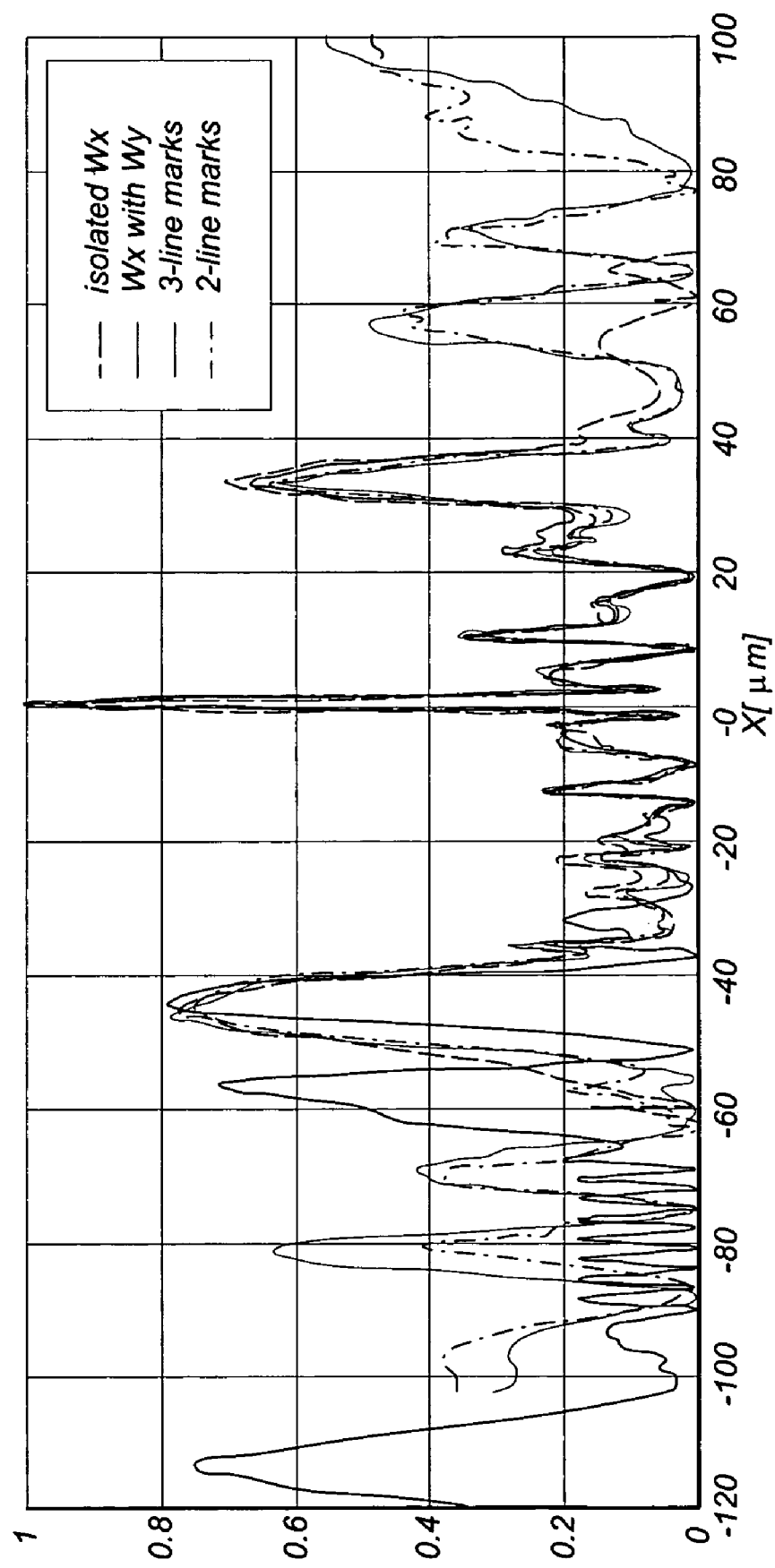
FIG. 17 shows a graph of the calculated multiple correlation coefficient template fit using a three peak template associated with the alignment mark of FIG. 14.

To find the alignment mark 18, the measured data is fit with the template. The quality of the fit is given by the MCC (Multiple Correlation Coefficient), a kind of normalized $\chi^2$:MCC=1 corresponds to an ideal fit, MCC=0 is the worst fit possible. This is repeated for all positions in the scan. The result of this procedure is an MCC as a function of position as shown in FIG. 17. A first plot (dashed line) is given for an isolated alignment mark 18 as described above, a second plot (thick line) for the alignment mark 18 with the additional alignment mark 19 (as shown in FIG. 14), and a third and fourth plot are shown for an alignment mark 18 surrounded by a 3-line mark (thin line) and 2-line mark (dash-dot line), respectively.

For this example of an alignment mark 18, it is clear that the alignment mark 18 not only gives the highest but also the sharpest MCC-peak. The decision algorithm in this case encompasses:

first: detect all peaks above a certain threshold and
second: find the sharpest peak.

Fitting the sharpest peak with a parabola then gives the peak position and consequently the capture position.

Note that the template fit and decision algorithm depend on the specific properties of the template (and thus of the alignment mark 18. For a specific fine alignment mark a fine capture is performed: in a small area (~20×20 μm) the central peak amongst a series of peaks in the alignment signal has to be found. The MCC as a function of position here behaves as a series of peaks of which the highest corresponds to the central peak position. In this embodiment, the decision algorithm only looks at the highest peak.

The template fit embodiment is a signal recognition algorithm but can in principle also be used as a fine alignment algorithm on non-periodic signals. It consists of the following steps:

1. Calibration (once): construct a template
2. Alignment: fit the measured signal over the length of the template interval with the template function and calculate the MCC.
3. Repeat this for all scan positions
4. From the MCC a.f.o. position, find the peak corresponding to the selected mark (2 examples have been given)
5. Determine the peak position It is noted that in the above examples, a one dimensional MCC is applied. However, it is also possible to use a two dimensional MCC in the alignment method in a similar manner.

The template fit is a numerical algorithm where a predetermined signal shape or template is compared to a measured signal over a range of positions. This is followed by a decision algorithm that qualifies the fit for each position and finds the position where the fit is best.

With the template fit, capture can be extended to arbitrary and non-periodic structures. This enhances capture robustness. The template fit can ultimately also be employed for fine alignment which realizes the ultimate alignment mark flexibility.

A lithographic apparatus according to one embodiment comprises an illumination system configured to condition a radiation beam; a support constructed to support a patterning device, the patterning device being capable of imparting the radiation beam with a pattern in its cross-section to form a patterned radiation beam; a substrate table constructed to hold a substrate; a projection system configured to project the patterned radiation beam onto a target portion of the substrate; and an alignment system which is configured to illuminate an alignment mark on the substrate with an illumination spot, the alignment mark comprising a plurality of lines and spaces, the alignment system comprising a combiner system which is configured to transfer two images of the illuminated alignment mark without spatial filtering of the images, rotate the images 180° relatively to each other, and combine the two images, and a detection system which is configured to detect an alignment signal from the combined images and to determine a unique alignment position by selecting a specific one of extreme values in the detected alignment signal. The determination of the unique (i.e. unambiguous) alignment position may e.g. be accomplished using signal matching techniques.

According to another embodiment, an alignment system for aligning a substrate, e.g. in a lithographic apparatus, comprises an illuminator system which is configured to illuminate an alignment mark on the substrate with an illumination spot, the alignment mark comprising a plurality of lines and spaces, a combiner system which is configured to transfer two images of the illuminated alignment mark without spatial filtering of the images, rotate the images 180° relatively to each other, and combine the two images, and a detection system which is configured to detect an alignment signal from the combined images and to determine a unique alignment position by selecting a specific one of extreme values in the detected alignment signal.

A device manufacturing method according to a further embodiment comprises projecting a patterned beam of radiation onto a substrate; illuminating an alignment mark in a scribe lane on the substrate with an illumination spot, the alignment mark comprising a plurality of lines and spaces, transferring the images of the illuminated alignment mark without spatial filtering of the images, combining two images of the alignment mark that are rotated by 180° relative to each other; and detecting an alignment signal from the combined images, and determining a unique alignment position by selecting a specific one of extreme values in the detected alignment signal.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
an alignment system configured to illuminate an alignment mark on a substrate with an illumination spot, the alignment mark comprising a plurality of lines and spaces in a scribe lane direction of the substrate, a dimension of the illumination spot being smaller than a length of the alignment mark in the scribe lane direction, the alignment system comprising:
a combiner system configured to transfer two images of the illuminated alignment mark without spatial filtering of the images, rotate the images 180° relatively to each other, and combine the two images, and
a detection system configured to detect an alignment signal from the combined images and to determine a unique alignment position by selecting one of a plurality of extreme values in the detected alignment signal.

2. The lithographic apparatus according to claim 1, wherein a length of a line segment passing through a center of the illumination spot and terminating at a periphery of the illumination spot is less than a length of the alignment mark in a direction of a scribe lane of the substrate.

3. The lithographic apparatus according to claim 1, wherein the alignment mark comprises N pairs of lines and spaces with a periodicity p, and
wherein a width of the illuminating spot, as measured through the center of the illumination spot and in the direction of a scribe lane of the substrate, is substantially equivalent to M pairs of lines and spaces, and
wherein the detected alignment signal includes a plurality of global extreme values having substantially equal amplitudes, and
wherein the selected extreme value is one of the plurality of global extreme values.

4. The lithographic apparatus according to claim 1, wherein the alignment mark comprises a combination of a first set of $N_1$ pairs of lines and spaces with a periodicity p, and a second set of $N_2$ pairs of lines and spaces with the periodicity p, and
wherein the first and second sets are separated by a space having a width greater than one of said spaces of the first set.

5. The lithographic apparatus according to claim 4, wherein $N_2$ is less than $N_1$, and
wherein a width of the illuminating spot, as measured through a center of the illumination spot and in the direction of a scribe lane of the substrate, is substantially equivalent to M pairs of lines and spaces, and
wherein the detected alignment signal includes a plurality of global extreme values having substantially equal amplitudes, and
wherein the detection system is configured to select a largest extreme value in a segment of the detected alignment signal corresponding to the second set of $N_2$ pairs, and
wherein the detection system is configured to select the one of a plurality of extreme values using the selected largest extreme value as a reference.

6. The lithographic apparatus according to claim 4, wherein $N_2$ is equal to $N_1$, and
wherein a width of the illuminating spot, as measured through a center of the illumination spot and in the direction of a scribe lane of the substrate, is substantially equivalent to M pairs of lines and spaces, M being less than $(N_1+N_2)$, and
wherein the detected alignment signal includes two segments having global extreme values and a local segment between the two segments, and
wherein the alignment system is arranged to select a local extreme value in the local segment as the selected extreme value.

7. The lithographic apparatus according to claim 1, wherein the alignment mark comprises n groups of m pairs of lines and spaces, each of the n groups having a periodicity p, and
wherein the detected alignment signal includes 2n−1 characteristic signal segments and a plurality of global extreme values,
wherein each of the plurality of global extreme values has substantially the same amplitude, and
wherein the selected extreme value is one of the plurality of global extreme values.

8. The lithographic apparatus according to claim 1, wherein the alignment mark comprises:
a first alignment mark structure in a direction of a scribe lane of the substrate, and
a second alignment mark structure comprising a set of n groups of m pairs of lines and spaces, each of the n groups having a periodicity p in a direction at a angle in the range of from zero to ninety degrees, inclusive, to the scribe lane direction, and
wherein the alignment system is arranged to detect the alignment signal while scanning the alignment mark at the angle to the scribe lane direction.

9. The lithographic apparatus according to claim 1, wherein a length of the alignment mark is substantially equal to eighty microns, a width of the alignment mark is substantially equal to forty microns, and a periodicity of the alignment mark is substantially equal to one micron.

10. The lithographic apparatus according to claim 1, wherein the alignment system is arranged to obtain an initial position of the alignment mark for aligning the illumination spot with the alignment mark.

11. The lithographic apparatus according to claim 1, wherein the combiner system comprises a set of optical elements configured to transfer two images of the illuminated alignment mark without spatial filtering of the images, rotate the images 180° relatively to each other, and combine the two images.

12. The lithographic apparatus according to claim 1, wherein the detection system comprises a detector configured to detect an alignment signal from the combined images and a signal analyzer configured to determine a unique alignment position by selecting one of a plurality of extreme values in the detected alignment signal.

13. The lithographic apparatus according to claim 1, wherein the selecting of one of a plurality of extreme values in the detected alignment signal comprises:
constructing a template function associated with the alignment marker having a predetermined template interval;
for a range of alignment positions, fitting the detected alignment signal with the template function for obtaining a multiple correlation coefficient as a function of alignment position; and determining from the multiple correlation coefficient as function of alignment position an extreme value associated with the alignment marker template and determining the unique alignment position from the extreme value.

14. An alignment system for aligning a substrate comprising:
a spot source configured to illuminate an alignment mark on the substrate with an illumination spot, a dimension of the illumination spot being smaller than a length of the alignment mark in a scribe lane direction;
a combiner system configured to transfer two images of the illuminated alignment mark without spatial filtering of the images, rotate the images 180° relatively to each other, and combine the two images; and
a detection system configured to detect an alignment signal from the combined images and to determine a unique alignment position by selecting one of a plurality of extreme values in the detected alignment signal.

15. The alignment system according to claim 14, wherein a length of a line segment passing through a center of the illumination spot and terminating at the periphery of the illumination spot is less than a length of the alignment mark in a direction of a scribe lane of the substrate.

16. The alignment system according to claim 14, wherein an area of the illumination spot is less than an area of the alignment mark.

17. The alignment system according to claim 14, wherein the alignment mark comprises N pairs of lines and spaces with a periodicity p,
wherein the detected alignment signal has a plurality of global extreme values having substantially equal amplitudes, and
wherein the selected extreme value is one of the plurality of global extreme values.

18. The alignment system according to claim 17, wherein a width of the illuminating spot, as measured through a center of the illumination spot and in the direction of a scribe lane of the substrate, is substantially equivalent to M pairs of lines and spaces.

19. The alignment system according to claim 14, wherein the alignment mark comprises a combination of a first set of $N_1$ pairs of lines and spaces with a periodicity p, and a second set of $N_2$ pairs of lines and spaces with the periodicity p, and
wherein the first and second sets are separated by a space.

20. The alignment system according to claim 19, wherein the space separating the first and second sets has a width greater than one of said spaces of the first set.

21. The alignment system according to claim 19, wherein $N_2$ is less than $N_1$, and
wherein the detection system is configured to select a largest extreme value in a segment of the detected alignment signal corresponding to the second set of $N_2$ pairs, and
wherein the detection system is configured to select the one of a plurality of extreme values using the selected largest extreme value as a reference.

22. The alignment system according to claim 21, wherein a width of the illuminating spot, as measured through the center of the illumination spot and in the direction of a scribe lane of the substrate, is substantially equivalent to M pairs of lines and spaces, and
wherein the detected alignment signal includes a plurality of global extreme values having substantially equal amplitudes.

23. The alignment system according to claim 19, wherein $N_2$ is equal to $N_1$, and wherein the detected alignment signal includes two segments having global extreme values and a local segment between the two segments, and
wherein the alignment system is arranged to select a local extreme value in the local segment as the selected extreme value.

24. The alignment system according to claim 23, wherein a width of the illuminating spot, as measured through the center of the illumination spot and in the direction of a scribe lane of the substrate, is substantially equivalent to M pairs of lines and spaces, M being less than $(N_1+N_2)$.

25. The alignment system according to claim 14, wherein the alignment mark comprises n groups of m pairs of lines and spaces, each of the n groups having a periodicity p,
wherein the detected alignment signal includes 2n−1 characteristic signal segments and a plurality of global extreme values, and
wherein the selected extreme value is one of the plurality of global extreme values.

26. The alignment system according to claim 25, wherein each of the plurality of global extreme values has substantially the same amplitude.

27. The alignment system according to claim 14, wherein the alignment mark comprises:
a first alignment mark structure in a direction of a scribe lane of the substrate, and
a second alignment mark structure comprising a set of n groups of m pairs of lines and spaces, each of the n groups having a periodicity p in a direction at a angle in the range of from zero to ninety degrees, inclusive, to the scribe lane direction, and
wherein the alignment system is arranged to detect the alignment signal while scanning the alignment mark at the angle to the scribe lane direction.

28. The alignment system according to claim 14, wherein a length of the alignment mark is substantially equal to eighty microns, a width of the alignment mark is substantially equal to forty microns, and a periodicity of the alignment mark is substantially equal to one micron.

29. The alignment system according to claim 14, wherein the alignment system is arranged to obtain an initial position of the alignment mark for aligning the illumination spot with the alignment mark.

30. The alignment system according to claim 14, wherein the combiner system comprises a set of optical elements configured to transfer two images of the illuminated alignment mark without spatial filtering of the images, rotate the images 180° relatively to each other, and combine the two images.

31. The alignment system according to claim 14, wherein the detection system comprises a detector configured to detect an alignment signal from the combined images and a signal analyzer configured to determine a unique alignment position by selecting one of a plurality of extreme values in the detected alignment signal.

32. The alignment system according to claim 14, wherein the detection system is configured to select one of a plurality of extreme values in the detected alignment signal by:
constructing a template function associated with the alignment marker having a predetermined template interval;
for a range of alignment positions, fitting the detected alignment signal with the template function for obtaining a multiple correlation coefficient as a function of alignment position; and
determining from the multiple correlation coefficient as function of alignment position an extreme value associated with the alignment marker template and determining the unique alignment position from the extreme value.

33. A device manufacturing method comprising:
illuminating an alignment mark in a scribe lane on a substrate with an illumination spot, the alignment mark comprising a plurality of lines and spaces in a scribe lane direction, a dimension of the illumination spot being smaller than a length of the alignment mark in the scribe lane direction;
transferring the images of the illuminated alignment mark without spatial filtering of the images;
combining two images of the alignment mark that are rotated by 180° relative to each other; and
detecting an alignment signal from the combined images and determining a unique alignment position by selecting an extreme value in the detected alignment signal.

34. The device manufacturing method according to claim 33, wherein an area of the illumination spot is less than an area of the alignment mark.

35. The device manufacturing method according to claim 33, wherein the alignment mark comprises N pairs of lines and spaces with a periodicity p,
wherein the detected alignment signal includes a plurality of global extreme values having substantially equal amplitudes, and
wherein the selected extreme value is one of the plurality of global extreme values.

36. The device manufacturing method according to claim 35, wherein a width of the illuminating spot, as measured through a center of the illumination spot and in the direction of a scribe lane of the substrate, is substantially equivalent to M pairs of lines and spaces.

37. The device manufacturing method according to claim 33, wherein the alignment mark comprises a combination of a first set of $N_1$ pairs of lines and spaces with a periodicity p, and a second set of $N_2$ pairs of lines and spaces with the periodicity p, and
wherein the first and second sets are separated by a space.

38. The device manufacturing method according to claim 37, wherein the space separating the first and second sets has a width greater than one of said spaces of the first set.

39. The device manufacturing method according to claim 37, wherein $N_2$ is less than $N_1$,
wherein the detection system is configured to select a the largest extreme value in a segment of the detected alignment signal corresponding to the second set of $N_2$ pairs, and
wherein the detection system is configured to select the extreme value using the selected largest extreme value as a reference.

40. The device manufacturing method according to claim 39, wherein a width of the illuminating spot, as measured through the center of the illumination spot and in the direction of a scribe lane of the substrate, is substantially equivalent to M pairs of lines and spaces, and
wherein the detected alignment signal includes a plurality of global extreme values having substantially equal amplitudes.

41. The device manufacturing method according to claim 37, wherein $N_2$ is equal to $N_1$,
wherein the detected alignment signal includes two segments having global extreme values and a local segment between the two segments, and
wherein the alignment system is arranged to select a local extreme value in the local segment as the selected extreme value.

42. The device manufacturing method according to claim 41, wherein a width of the illuminating spot, as measured through the center of the illumination spot and in the direction of a scribe lane of the substrate, is substantially equivalent to M pairs of lines and spaces, M being less than $(N_1+N_2)$.

43. The device manufacturing method according to claim 33, wherein the alignment mark comprises n groups of m pairs of lines and spaces, each of the n groups having a periodicity p,
wherein the detected alignment signal includes 2n−1 characteristic signal segments and a plurality of global extreme values, and
wherein the selected extreme value is one of the plurality of global extreme values.

44. The device manufacturing method according to claim 43, wherein each of the plurality of global extreme values has substantially the same amplitude.

45. The device manufacturing method according to claim 33, wherein the alignment mark comprises:
a first alignment mark structure in a direction of a scribe lane of the substrate, and
a second alignment mark structure comprising a set of n groups of m pairs of lines and spaces, each of the n groups having a periodicity p in a direction at a angle in the range of from zero to ninety degrees, inclusive, to the scribe lane direction, and
wherein the alignment system is arranged to detect the alignment signal while scanning the alignment mark at the angle to the scribe lane direction.

46. The device manufacturing method according to claim 33, wherein a length of the alignment mark is substantially equal to eighty microns, a width of the alignment mark is substantially equal to forty microns, and a periodicity of the alignment mark is substantially equal to one micron.

47. The device manufacturing method according to claim 33, said method comprising obtaining an initial position of the alignment mark for aligning the illumination spot with the alignment mark.

48. The device manufacturing method according to claim 33, wherein selecting an extreme value comprises:
constructing a template function associated with the alignment marker having a predetermined template interval;
for a range of alignment positions, fitting the detected alignment signal with the template function for obtaining a multiple correlation coefficient as a function of alignment position; and
determining from the multiple correlation coefficient as function of alignment position an extreme value associated with the alignment marker template and determining the unique alignment-position from the extreme value.

49. A method of aligning a substrate, said method comprising:
illuminating an alignment mark on the substrate with a spot, said alignment mark including an alternating plurality of lines and spaces;
rotating at least one of two images of the illuminated mark with respect to the other such that a rotation of one of the images with respect to the other is substantially equal to one-hundred-eighty degrees to produce a combined image, said combined image being based on said two images subsequent to said rotating;

detecting an alignment signal based on the combined image, said alignment signal including a plurality of locally extreme values having substantially equal amplitudes;

and selecting one of a plurality of locally extreme values in the detected alignment signal.

50. An alignment system comprising:

a spot source configured to illuminate an alignment mark on a substrate with an illumination spot;

a plurality of optical elements configured to rotate at least one of two images of the illuminated mark with respect to the other such that a rotation of one of the images with respect to the other is substantially equal to one-hundred-eighty degrees to produce a combined image, said combined image being based on said two images subsequent to said rotating;

a detector configured to detect an alignment signal from the combined image, said detected alignment signal including a plurality of locally extreme values having substantially equal amplitudes; and a signal analyzer configured to determine a unique alignment position by selecting one of a plurality of locally extreme values in the detected alignment signal.

* * * * *